(12) United States Patent
Mun

(10) Patent No.: US 8,693,252 B2
(45) Date of Patent: Apr. 8, 2014

(54) METHOD AND SYSTEM FOR ADJUSTING READ VOLTAGE IN FLASH MEMORY DEVICE

(75) Inventor: Kui-Yon Mun, Hwaseong-Si (KR)

(73) Assignee: Samsung Electronics Co., Ltd., Suwon-si, Gyeonggi-do (*) Notice: Subject to any disclaimer, the term of this patent is extended or adjusted under 35 U.S.C. 154(b) by 84 days.

(21) Appl. No.: 13/543,902

(22) Filed: Jul. 9, 2012

(65) Prior Publication Data
US 2013/0016562 A1 Jan. 17, 2013

(30) Foreign Application Priority Data
Jul. 12, 2011 (KR) .................. 10-2011-0068792

(51) Int. Cl.
*G11C 16/04* (2006.01)

(52) U.S. Cl.
USPC ............ 365/185.12; 365/185.18; 365/185.21; 365/185.33

(58) Field of Classification Search
USPC ............. 365/185.12, 185.18, 185.19, 185.21, 365/185.33, 236
See application file for complete search history.

(56) References Cited

U.S. PATENT DOCUMENTS 8,456,912 B2* 6/2013 Han et al. ............... 365/185.12
2010/0287410 A1 11/2010 Li

FOREIGN PATENT DOCUMENTS

JP 2005-242903 9/2005
KR 1020100127406 12/2010

* cited by examiner

*Primary Examiner* — David Lam
(74) *Attorney, Agent, or Firm* — Volentine & Whitt, PLLC

(57) ABSTRACT

A method is provided for adjusting a read voltage in a flash memory device. The method includes storing first program count information when first pages of flash memory cells are programmed, the first program count information indicating a number of bits having a first logic value from among bits of data programmed in the first pages of the flash memory cells, and obtaining first read count information by counting a number of bits having the first logic value from among bits of data read from the first pages of the flash memory cells, while reading data from the flash memory cells using read voltages. The read voltages are adjusted based on the difference between the first read count information and the first program count information.

20 Claims, 15 Drawing Sheets

FIG. 9

| RC_1-PC_1 | ΔVR21 | ΔVR1 | ΔVR22 |
|---|---|---|---|
| ~-300 | +200mV | +400mV | +500mV |
| -299~-200 | +100mV | +200mV | +300mV |
| -199~-100 | +50mV | +100mV | +200mV |
| -99~99 | PDATA_2 | | |
| 100~199 | -50mV | -100mV | -200mV |
| 200~299 | -100mV | -200mV | -300mV |
| 300~ | -150mV | -300mV | -400mV |

FIG. 10

| RC_2-PC_2 | ΔVR21 | ΔVR1 | ΔVR22 |
|---|---|---|---|
| ~-200 | +100mV | 0mV | 0mV |
|  | +50mV | 0mV | -80mV |
| -199~-100 | +50mV | 0mV | 0mV |
|  | +30mV | 0mV | -40mV |
| -99~-50 | +20mV | 0mV | 0mV |
|  | +10mV | 0mV | -20mV |
| -49~49 | RETRY or UNCORRECT | | |
| 50~99 | -20mV | 0mV | 0mV |
|  | -10mV | 0mV | +20mV |
| 100~199 | -50mV | 0mV | 0mV |
|  | -30mV | 0mV | +40mV |
| 200~ | -100mV | 0mV | 0mV |
|  | -50mV | 0mV | +80mV |

METHOD AND SYSTEM FOR ADJUSTING READ VOLTAGE IN FLASH MEMORY DEVICE

CROSS-REFERENCE TO RELATED APPLICATIONS

A claim of priority under 35 U.S.C. §119 is made to Korean Patent Application No. 10-2011-0068972, filed on Jul. 12, 2011, in the Korean Intellectual Property Office, the entire contents of which are hereby incorporated by reference.

BACKGROUND

The inventive concept relates to flash memory techniques, and more particularly, to a method of adjusting a read voltage based on the state of data programmed in a flash memory device, and a method of reading data from the flash memory device by using the same.

In general, flash memory devices may be classified as a single-level cell (SLC) flash memory device or a multi-level cell (MLC) flash memory device, according to the number of data bits programmed in one memory cell. The SLC flash memory device has two distributions of threshold voltages of cells, and the M-bit MLC flash memory device has $2^M$ distributions of threshold voltages of cells. Here, "M" is an integer equal to or greater than "2." However, a distribution of threshold voltages of a programmed memory cell may vary due to various causes. Thus, data programmed in the memory cell may be different from data read from the memory cell.

SUMMARY

Embodiments of the inventive concept provide a method of adjusting a read voltage in a flash memory device in order to improve data reliability and speed of outputting data.

Embodiments of the inventive concept also provide a method of reading data from a flash memory device, while improving data reliability and speed of outputting data.

According to an embodiment, there is provided a method of adjusting a read voltage in a flash memory device. The method includes storing first program count information when first pages of flash memory cells are programmed, the first program count information indicating a number of bits having a first logic value from among bits of data programmed in the first pages of the flash memory cells; obtaining first read count information by counting a number of bits having the first logic value from among bits of data read from the first pages of the flash memory cells, while reading data from the flash memory cells using read voltages; and adjusting the read voltages based on the difference between the first read count information and the first program count information.

Adjusting of the read voltages may include applying voltage level compensation values of the read voltages to the read voltages, the voltage level compensation values corresponding to the difference between the first read count information and the first program count information. Adjusting the read voltages may include increasing or reducing the read voltages to be proportional to the difference between the first read count information and the first program count information.

The method may further include storing second program count information during the programming of the flash memory cells, the second program count information indicating a number of bits having the first logic value from among bits of data programmed in second pages of the flash memory cells; and obtaining second read count information by counting a number of bits having the first logic value from among bits of data read from the second pages of the flash memory cells, while reading data from the flash memory cells. Adjusting the read voltages may be further based on the difference between the second read count information and the second program count information.

Adjusting the read voltages may include determining an error mode based on the difference between the first read count information and the first program count information and the difference between the second read count information and the second program count information; reading voltage level compensation values of the read voltages, which correspond to the difference between the first read count information and the first program count information and the difference between the second read count information and the second program count information, according to the error mode; and respectively applying the voltage level compensation values to the read voltages.

When the difference between the first read count information and the first program count information falls within a predetermined range, adjusting the read voltages may include increasing or reducing some of the read voltages, based on the difference between the second read count information and the second program count information.

The method may further include randomizing received data and programming a result of the randomizing in the flash memory cells, and de-randomizing data read from the flash memory cells. The method may further include randomizing the first program count information and storing a result of the randomizing in a spare region of the flash memory cells, and de-randomizing and reading the result of the randomizing stored in the spare region.

According to another embodiment, there is provided a method of reading data from a flash memory device. The method includes, when an uncorrectable error is detected while reading data from flash memory cells using read voltages, each flash memory cell having at least one page, reading first page data as first read data from first pages of the flash memory cells in which data having the uncorrectable error is programmed; reading first program count information, stored when the first page data is programmed in the first pages of the flash memory cells, where the first program count information is a number of bits having a first logic value from among bits of the first page data; obtaining first read count information, which is a number of bits having the first logic value from among bits of the first page read data; adjusting the read voltages based on the difference between the first read count information and the first program count information; and reading the data again from the first pages of the flash memory cells using the adjusted read voltages.

Adjusting the read voltages may include reading voltage level compensation values of the read voltages corresponding to the difference between the first read count information and the first program count information, based on a read retry table defining the voltage level compensation values; and respectively applying the voltage level compensation values to the read voltages.

The first logic value may be a logic value in an erase state. When size of the first program count information is greater than size of the first read count information, the read voltages are increased to be proportional to the difference between the first read count information and the first program count information. When the size of the first program count information is less than the size of the first read count information, the read voltages are reduced to be proportional to the difference between the first read count information and the first program count information.

The flash memory cells may be M-bit multi-level cells, where M denotes an integer that is equal to or greater than "2". The first pages may be pages that are first programmed in the flash memory cells.

The method may further include, when the difference between the first read count information and the first program count information falls within a predetermined range, reading second page data as second page read data from a second page of the flash memory cells in which the data having the uncorrectable error is programmed; reading second program count information, stored when the second page data is programmed in the second pages of the flash memory cells, where the second program count information is a number of bits having the first logic value from among bits of the second page data; obtaining second read count information that is a number of bits having the first logic value from among bits of the second page read data; and adjusting some of the read voltages based on the difference between the first read count information and the second program count information.

The flash memory cells may be M-bit multi-level cells, where M denotes an integer that is equal to or greater than "2". The first pages may be pages that are first programmed in the flash memory cells, and the second pages may be pages that are lastly programmed in the flash memory cells.

The first logic value may be a logic value in an erase state. When size of the second program count information is greater than size of the second read count information, a lowest read value from among the read voltages may be increased, and when the size of the second program count information is less than the size of the second read count information, the lowest read value from among the read voltages may be reduced.

According to another embodiment, a flash memory system includes a flash memory device and a memory controller. The flash memory device includes a memory cell array having memory cells, and a voltage generator configured to generate a program voltage and a read voltage. The memory controller is configured to control programming of data in the memory cells using the program voltage and to control reading the data from the memory cells using the read voltage. The memory controller includes a program counter configured to provide first program count information when first pages of the memory cells in the memory cell array are programmed, the first program count information indicating a number of bits having a first logic value from among multiple bits of the data to be programmed in the first pages of the memory cells; a read counter configured to provide first read count information indicating a number of bits having the first logic value from among bits of the data read from the first pages of the memory cells while reading the data from the memory cells; and a read voltage adjustment unit configured to calculate the difference between the first read count information and the first program count information, and to generate a voltage level compensation signal based on the difference. The voltage generator of the flash memory device adjusts the read voltage for reading the data from the memory cells based on the voltage level compensation signal.

BRIEF DESCRIPTION OF THE DRAWINGS

Illustrative embodiments will be more clearly understood from the following detailed description taken in conjunction with the accompanying drawings, in which:

FIGS. 9 and 10 illustrate read retry tables, according to embodiments of the inventive concept;

DETAILED DESCRIPTION OF THE EMBODIMENTS

Figure 1:
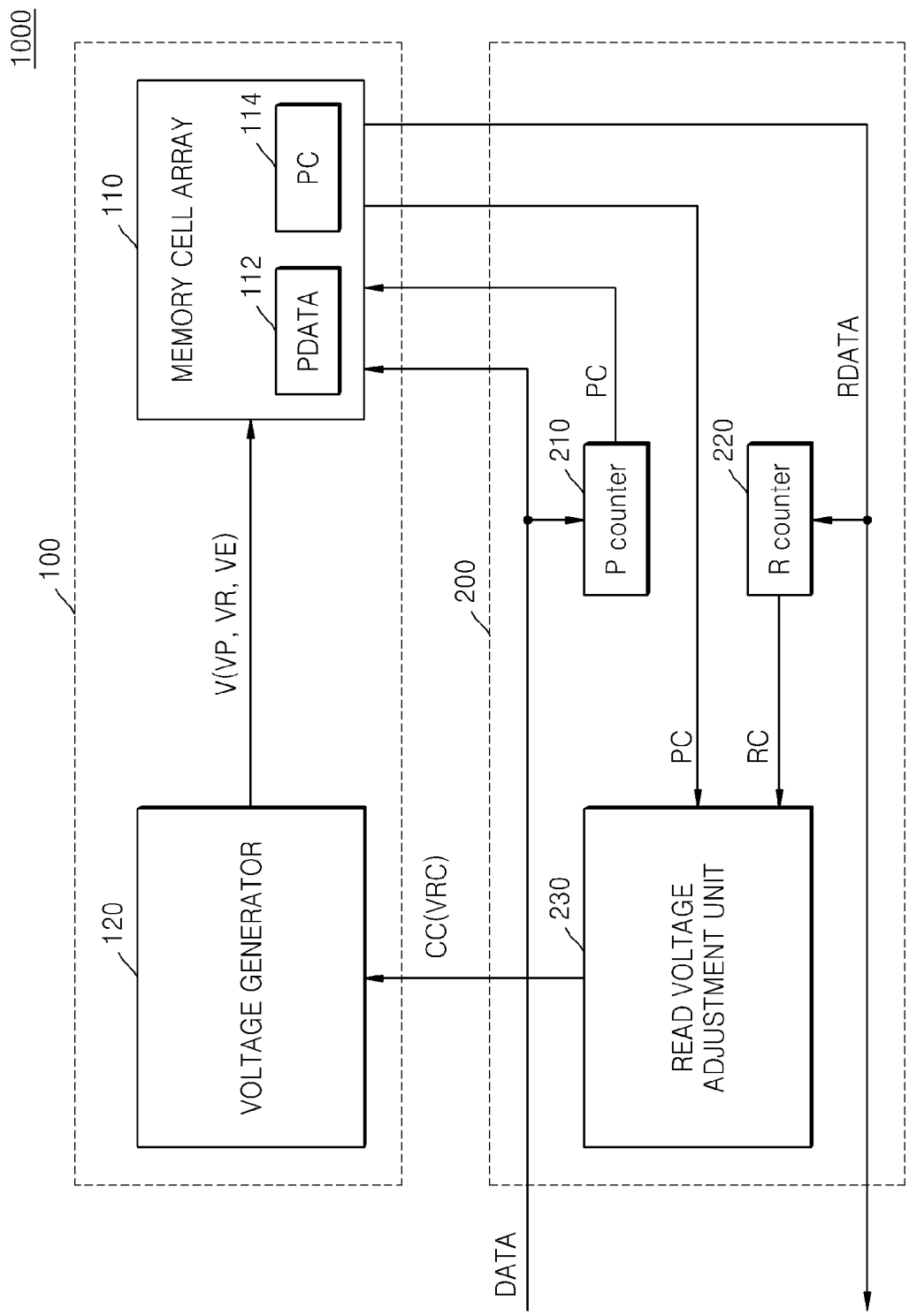
FIG. 1 is a schematic block diagram of a flash memory system, according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms, "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the present teachings.

It will be understood that when an element, such as a layer, a region, or a substrate, is referred to as being "connected to" or "coupled to" another element, it may be directly connected or coupled to the other element or intervening elements may be present. In contrast, when an element is referred to as being "directly connected to" or "directly coupled to" another element or layer, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic block diagram of a flash memory system 1000, according to an embodiment of the inventive concept. Referring to FIG. 1, the flash memory system 1000 includes a flash memory device 100 and a memory controller 200. The flash memory device 100 includes a memory cell array 110 and a voltage generator 120.

FIG. 1 is based on flow of data input to and output from the flash memory system 1000. Generally, control signals or control commands for performing a program operation, a read operation, and an erase operation on the flash memory system 1000 are not described in detail to avoid obscuring the inventive concept. Nevertheless, such control signals or control commands would be apparent to one of ordinary skill in the art.

In the flash memory device 100, data is stored in the memory cell array 110. Although not shown, the memory cell array 110 includes multiple memory cells connected to multiple word lines and multiple bit lines. Each of the memory cells may store at least one bit. When a memory cell is configured to store one bit, the memory cell may be referred to as a single-level cell (SLC). When a memory cell is configured to store multiple bits, the memory cell may be referred to as a multi-level cell (MLC). When an MLC is able to store M bits, the MLC may be referred to as an M-bit MLC. Here, "M" is an integer equal to or greater than "2", and may be generally "2", "3" or "4".

The memory cell array 110 includes a main region 112 and a spare region 114. User data, which is accessible by a user, is stored in the main region 112. Auxiliary data of the user data, e.g., error correction information, or data for managing the flash memory device 100, e.g., status information or failure information, is stored in the spare region 114.

Although not shown in FIG. 1, the memory cell array 110 may include word lines and bit lines connected to the memory cells, and may include a word line decoder/driver connected to the word lines and a bit line decoder/driver connected to the bit lines, as a core circuit. The word line decoder/driver may activate a word line corresponding to an address that is to be accessed from among the word lines of the memory cell array 110. The bit line decoder/driver may activate a bit line corresponding to an address that is to be accessed from among the bit lines of the memory cell array 110.

The memory controller 200 controls programming of data in the memory cell array 110 of the flash memory device 100 or reading of data from the memory cell array 110. The memory controller 200 may receive data DATA to be programmed in the main region 112 of the memory cell array 110 from the outside, and may transmit data RDATA read from the main region 112 of the memory cell array 110 to the outside. Although FIG. 1 illustrates the memory controller 200 as a memory controller chip outside the flash memory device 100, the memory controller 200 may be embodied as a peripheral circuit installed in the flash memory device 100.

Although not shown in FIG. 1, the memory controller 200 may receive a control command, e.g., a program command, a read command, or an erase command, from the outside. The control command may include an address at which the control command is to be performed. The address may indicate the logical or physical location of the memory cell array 110, in which the data DATA is to be programmed, or from which the data DATA is to be read or erased. The memory controller 200 may provide the address to the word line decoder/driver and the bit line decoder/driver. Then, the word line decoder/driver and the bit line decoder/driver respectively activate a corresponding word line and a corresponding bit line.

Also, the memory controller 200 transmits a control signal CC to the flash memory device 100. In the flash memory device 100, the voltage generator 120 applies a driving voltage V to the memory cell array 110 according to the control signal CC. Examples of the driving voltage V may include a program voltage VP, a read voltage VR, and an erase voltage VE.

The memory controller 200 receives the data DATA, and control the data DATA to be stored in the memory cell array 110 of the flash memory device 100. The data DATA is stored in the main region 112 of the memory cell array 110. Data programmed in the main region 112 of the memory cell array 110 may be referred to as program data PDATA. Also, the memory controller 200 controls the program data PDATA to be read from the memory cell array 110 of the flash memory device 100, and provides a result of the reading the program data PDATA as read data RDATA to the outside.

However, as time goes by and/or the flash memory system 1000 reaches its endurance limit, an initially stored distribution of threshold voltages of the memory cells changes, which may result in changes to information stored in the memory cell array 110. Also, the distribution of threshold voltages of memory cells may change when peripheral memory cells are accessed. As a result, the program data PDATA programmed in the memory cell array 110 may not be the same as the read data RDATA read from the memory cell array 110. To solve this problem, error correction information is stored in the spare region 114 of the memory cell array 110. However, using the error correction information does not necessarily correct the problem. Thus, according to an embodiment, program count information PC is further used to increase the probability of correcting such errors. The program count information PC is stored in the spare region 114.

The memory controller 200 generates a voltage level compensation signal VRC for compensating for a read voltage VR applied by the voltage generator 120 using the program count information PC. The voltage level compensation signal VRC may be transmitted in the form of a control command to the voltage generator 120 of the flash memory device 100, for example.

Figure 2:
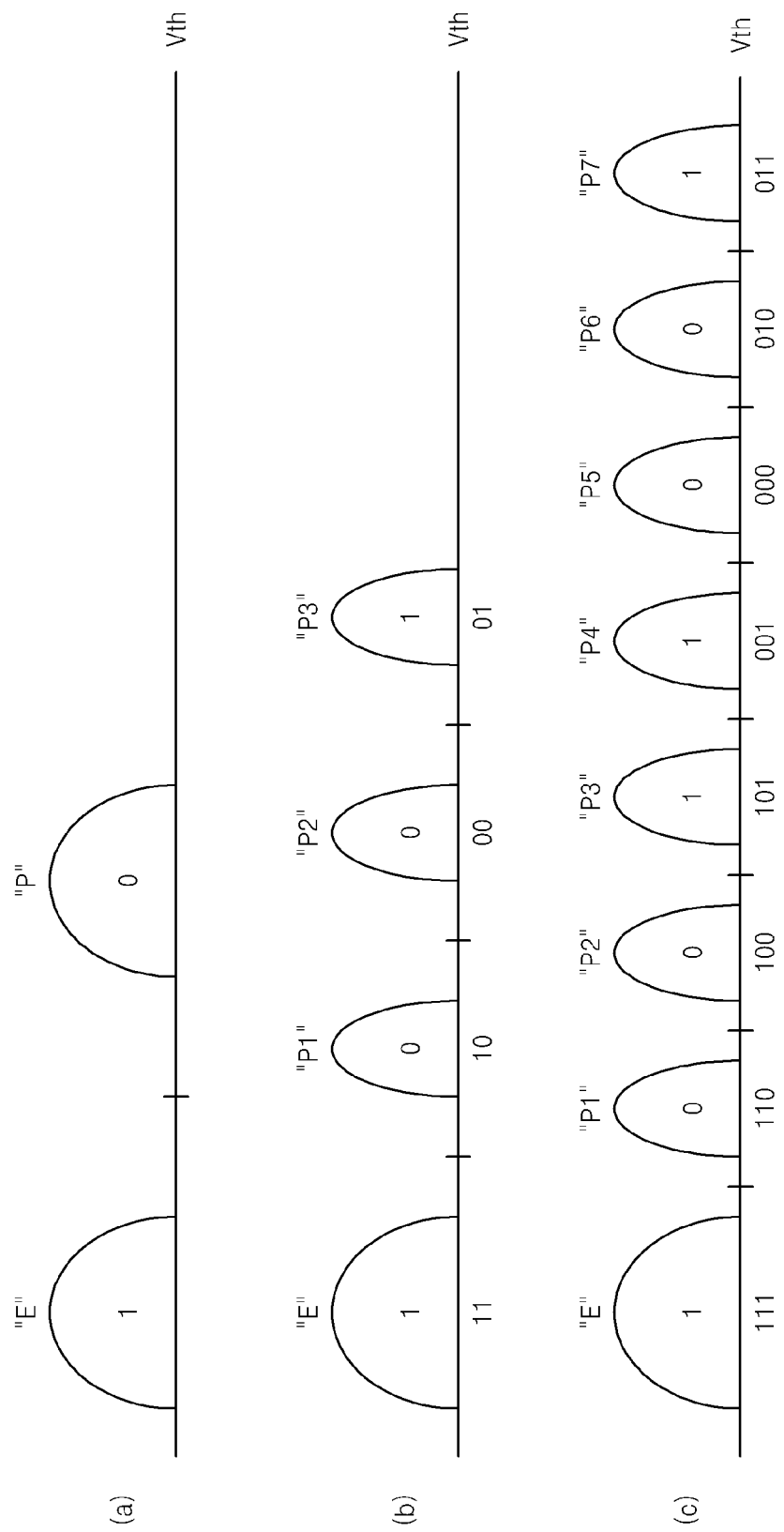
FIG. 2 illustrates distributions of threshold voltages of cells in a flash memory device illustrated in FIG. 1.

The program voltage VP may be set in such a manner that the memory cells have a distribution of threshold voltages corresponding to bit values, as illustrated in FIG. 2.

FIG. 2(*a*) illustrates a distribution of threshold voltages in a single-level cell flash memory device (hereinafter referred to as "SLC flash memory device"). FIGS. 2(*b*) and 2(*c*) illustrate distributions of threshold voltages in a multi-level cell flash memory device (hereinafter referred to as "MLC flash memory device"). In the MLC flash memory device, at least two bits are programmed in a memory cell. Specifically, FIG. 2(*b*) illustrates a distribution of threshold voltages in a 2-bit MLC flash memory device, and FIG. 2(*c*) illustrates a distribution of threshold voltages in a 3-bit MLC flash memory device.

Referring to FIG. 2(*a*), each of the SLC memory cells have one of two states, i.e., an erase state "E" and a program state "P". Referring to FIG. 2(*b*), each of the 2-bit MLC memory cells have one of four states, i.e., an erase state "E" and program states "P1", "P2" and "P3". Referring to FIG. 2(*c*), each of the 3-bit MLC memory cells has one of eight states, i.e., an erase state "E" and program states "P1" to "P7".

Unless otherwise indicated, general operations of an MLC flash memory device will be described below with respect to a 2-bit MLC flash memory device, for convenience of explanation.

Two bits programmed in a memory cell include an upper bit and a lower bit. In this case, a page for the upper bit and a page for the lower bit are programmed in memory cells included in the memory cell array 110 of FIG. 1, which are connected to the same word line. However, since in general, an upper bit and a lower bit are included in two different pages, an upper bit and a lower bit that are to be programmed in a memory cell are programmed using different logical page addresses.

Figure 3:
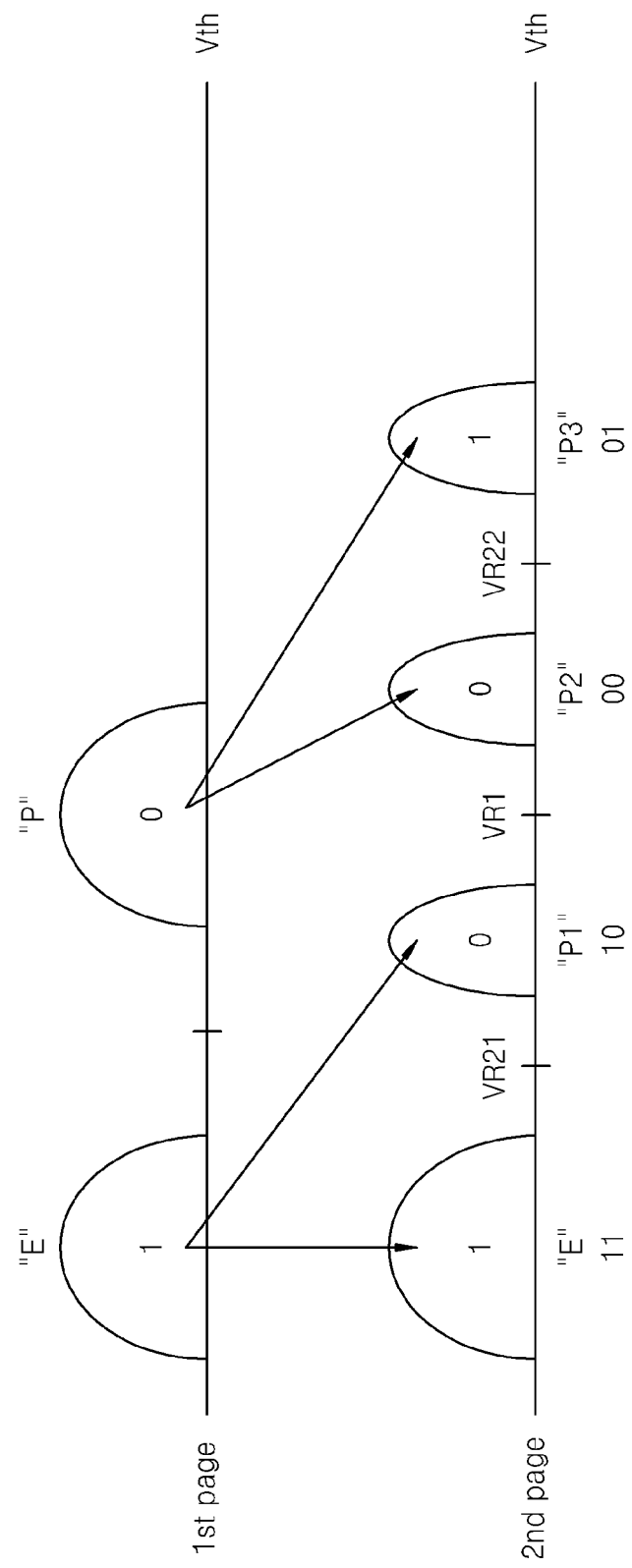
FIG. 3 illustrates programming of a 2-bit multi-level cell (MLC) flash memory device, according to an embodiment of the inventive concept.

Referring to FIG. 3, in order to program a 2-bit MLC flash memory device, a first-page programming operation is performed on memory cells, and a second-page programming operation is then performed on the memory cells based on a distribution of threshold voltages obtained after performing the first-page programming operation. In FIG. 3, a page for an upper bit and a page for a lower bit are respectively illustrated as a first page and a second page, but the order of programming pages may vary according to the design of the flash memory device 100 of FIG. 1.

For convenience of explanation, first page means a page that is first programmed in memory cells, and second page means a page other than the first page. In the case of a 2-bit MLC flash memory device, for example, the second page means the page that is secondly programmed in memory cells. However, in the case of a multi-bit MLC flash memory device including 3-bits or more, the second page may refer to either a page that is secondly programmed in memory cells or a page that is lastly programmed in the memory cells.

All of memory cells that have yet to be programmed have an "E" state. When the first-page programming operation is performed on the memory cells, then the memory cells having a logic value of "0" for a bit in the first page are programmed to have a "P" state, and the other memory cells having a logic value "1" for a bit in the first page are programmed to maintain the "E" state.

Then, when the second-page programming operation is performed on the memory cells, then each of the memory cells have the "E" state, a "P1" state, a "P2" state, or a "P3" state. In this case, memory cells having logic values of "1" for the bits in the first and second pages are maintained in the "E" state, and memory cells having logic values of "1" for the bit in the first page and "0" for the bit in the second page are programmed from the "E" state to the "P1" state. Also, memory cells having logic values of "0" for the bits in the first and second pages are programmed from the "P" state to the "P2" state, and memory cells having logic values of "0" for the bit in the first page and "1" for the bit in the second page are programmed from the "P" state to the "P3" state. After the performing of the first-page programming operation and the second-page programming operation on the memory cells ends, the memory cells have a distribution of threshold voltages as illustrated in FIG. 2(*b*).

Read voltages VR1, VR21 and VR22 may be used to read logic values of the memory cells. When the read voltage VR1 is applied to the memory cells, the memory cells having the "E" state and the "P1" state are turned on and the memory cells having the "P2" state and the "P3" state are turned off. It may therefore be determined whether the bit in the first page of a memory cell is "0" or "1" by sensing the result of applying the read voltage VR1. In other words, when a memory cell is turned on in response to application of the read voltage VR1, the upper bit of data stored in the memory cell is "1", and when the memory cell is turned off in response to application of the read voltage VR1, the upper bit of the data stored in the memory cell is "0".

The read voltages VR21 and VR22 are used to determine logic values of the bit in the second page. If an "on/off" state of a memory cell when the read voltage VR21 is applied thereto is the same as when the read voltage VR22 is applied thereto, then the lower bit of data stored in the memory cell is "1". If the "on/off" state of the memory cell when the read voltage VR21 is applied thereto is different than when the read voltage VR22 is applied thereto, then the lower bit of the data stored in the memory cell is "0".

Figure 4:
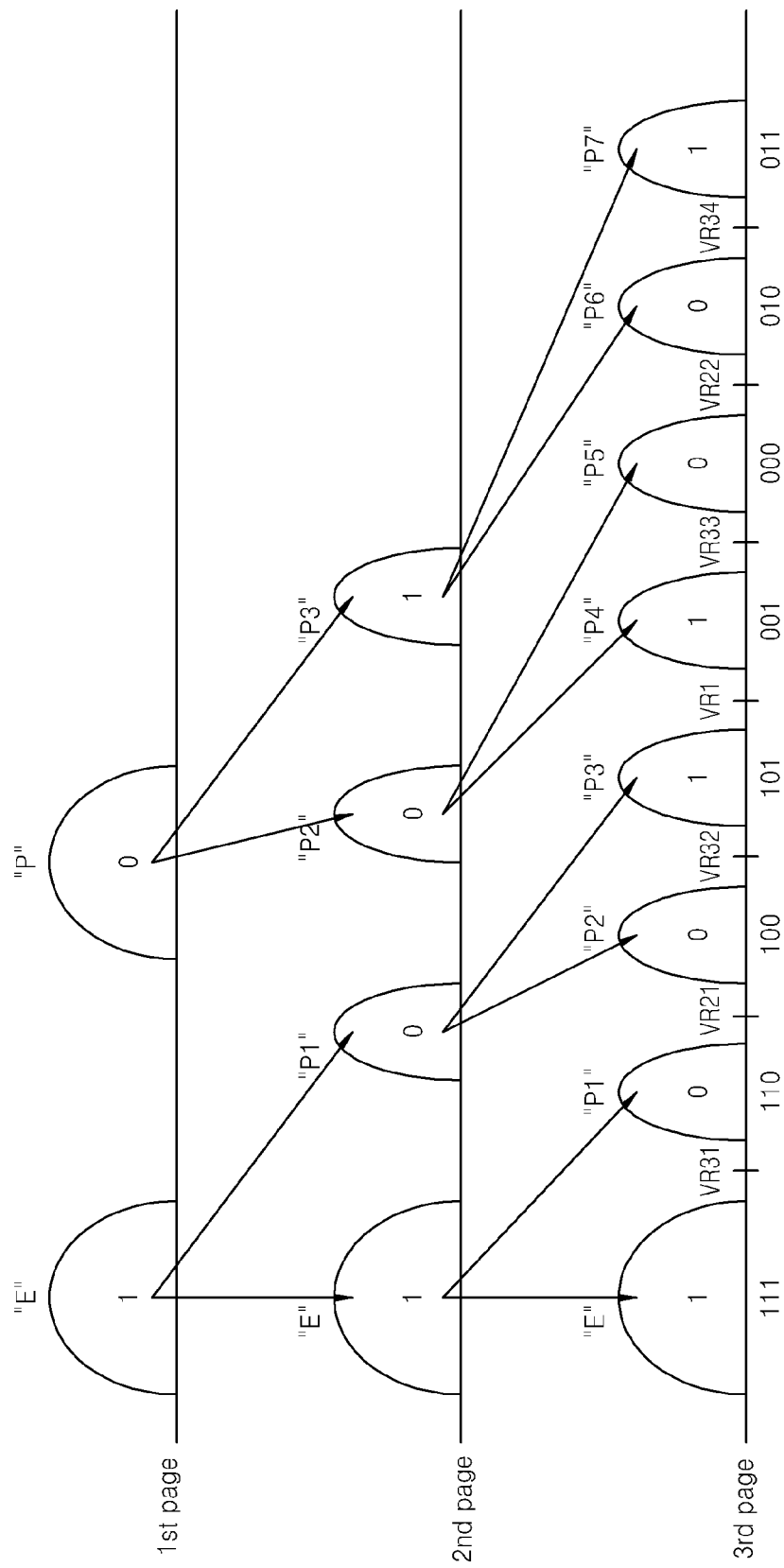
FIG. 4 illustrates programming of a 3-bit MLC flash memory device, according to another embodiment of the inventive concept.

In the case of a 3-bit MLC flash memory device, the first-page programming operation and the second-page programming operation are sequentially performed as described above, and then a third-page programming operation is performed as illustrated in FIG. 4. Similarly, a 4-bit MLC flash memory device is also programmed on multiple bits therein.

During a read operation, the logic value of a first bit of data stored in a memory cell is determined using the read voltage VR1, in a manner similar to the manner in which a first bit of data in a 2-bit MLC flash memory device is determined. Also, the logic value of a second bit of the data stored in the memory cell is similarly determined using the read voltages VR21 and VR22. Furthermore, read voltages VR31, VR32, and VR33 are used to determine the logic value of a third bit of the data stored in the memory cell. Here, the first bit means a bit stored by performing the first-page programming operation, the second bit means a bit stored by performing the second-page programming operation, and the third bit means a bit stored by performing the third-page programming operation.

The programming methods described above with reference to FIGS. 3 and 4 are merely illustrative, and the embodiments of the inventive concept are not limited thereto. However, for convenience of explanation, it is hereinafter assumed that memory cells are programmed according to the methods of FIGS. 3 and 4.

Referring again to FIG. 1, the memory controller 200 includes a program counter 210, a read counter 220, and a read voltage adjustment unit 230. The program counter 210 counts the number of bits having a first logic value from among multiple bits of data DATA input to the memory controller 200. For example, the program counter 210 may count the number of bits having the first logic value in the data DATA on the basis of an error correction unit.

The error correction unit is a unit in which the memory controller 200 performs error correction on data. For example, the memory controller 200 may correct errors in the data DATA on the basis of a page unit. Alternatively, the memory controller 200 may correct errors in the data DATA on the basis of page units or a block unit. If at least two sectors are included in one page, the memory controller 200 may correct errors in the data DATA on the basis of a sector unit. It is assumed below that errors in data are corrected on the basis of a page unit, but the embodiments of the inventive concept are not limited thereto. In other words, error correction may be performed on a basis other than the page unit, and the program counter 210 may count the number of bits having the first logic value in data on a basis other than the page unit, without departing from the scope of the present teachings. For example, the number of bits having the first logic value included in each sector may be counted on the basis of the sector unit.

The first logic value may be logic high or logic low. In other words, the first logic value may be "1" or "0". However, it is assumed that for convenience of explanation, the first logic value is a logic value corresponding to an erase state. That is, it is assumed that the first logic value is "1", according to FIGS. 3 and 4.

The program counter 210 may count the number of bits having a logic value of "1", on the basis of the page unit, as discussed above. A result of the counting may be referred to as "program count information PC". The program count information PC may be stored in the spare region 114 of the memory cell array 110 as illustrated in FIG. 1. Alternatively, the program count information PC may be stored together with program data PDATA in the main region 112 of the memory cell array 110 as opposed to the spare region 114.

The program data PDATA indicates the data DATA from which the program count information PC is obtained. The program data PDATA may be data obtained on the basis of the page unit, for example. In this case, the program data PDATA and the program count information PC may be stored in memory cells connected to the same word line. If the program data PDATA is programmed in a first page of each memory cell connected to a word line, then the program count information PC may also be stored in the first page of each memory cell.

The memory controller 200 is also configured to read the program data PDATA from the memory cell array 110. In this case, the memory controller 200 reads the program count information PC corresponding to the program data PDATA, together with the program data PDATA. A result of the reading may be referred to as "read data RDATA". As described above, the program data PDATA and the read data RDATA may be different from each other, due to a change in distribution of threshold voltages of memory cells.

The read counter 220 counts the number of bits having the first logic value from among bits of the read data RDATA. The result of the counting may be referred to as read count information RC, and may be provided together with the program count information PC to the read voltage adjustment unit 230.

The read voltage adjustment unit 230 compares the read count information RC and the program count information PC with each other, calculates the difference between values thereof, and generates a voltage level compensation signal VRC based on the difference. The voltage level compensation signal VRC is provided to the voltage generator 120 of the flash memory device 100, and the voltage generator 120 adjusts the read voltage VR for reading the program data PDATA from the memory cell array 110, based on the voltage level compensation signal VRC.

Figure 5:
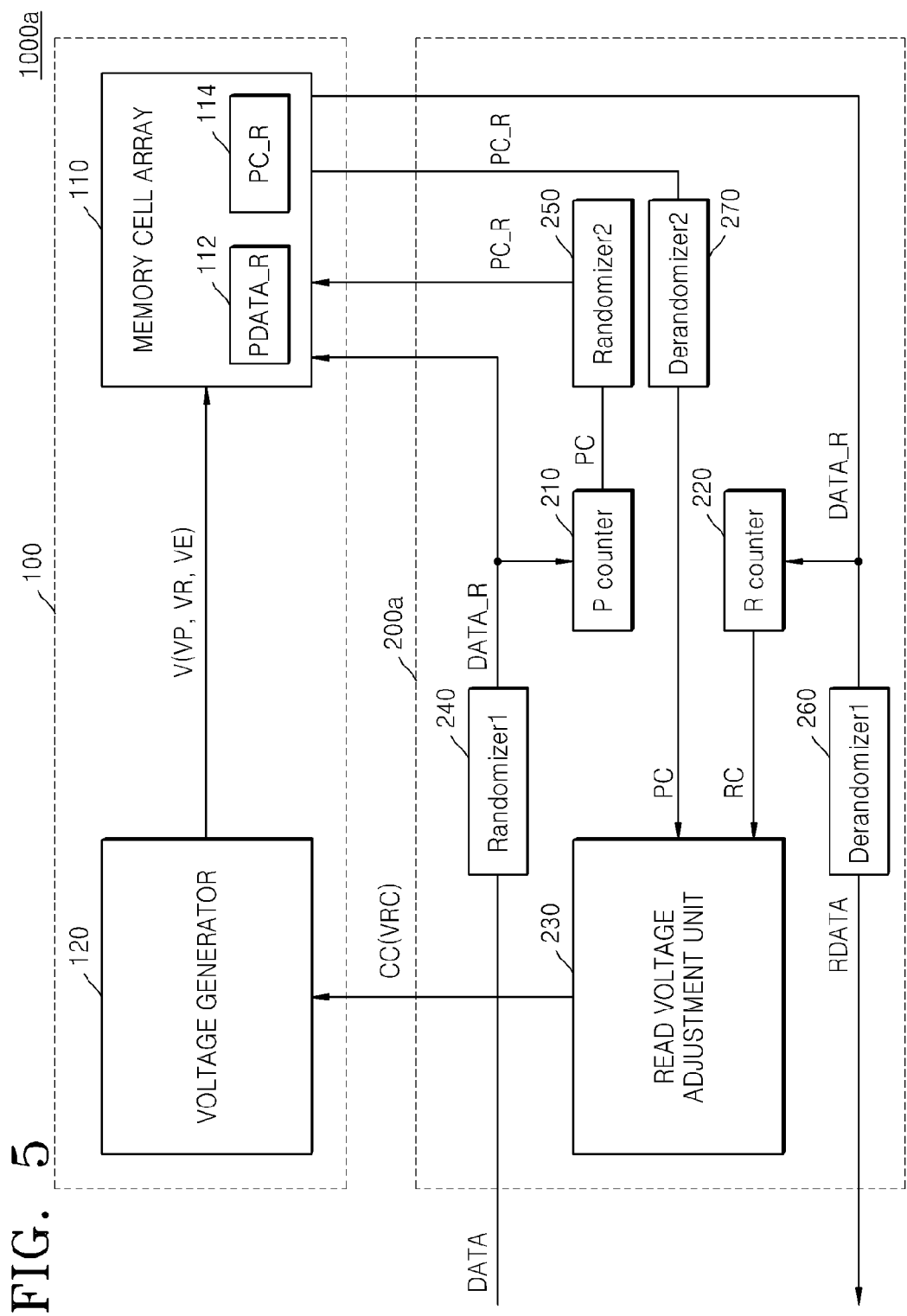
FIG. 5 is a block diagram of a flash memory system according to another embodiment of the inventive concept.

FIG. 5 is a block diagram of a flash memory system 1000a according to another embodiment of the inventive concept. Referring to FIG. 5, the flash memory system 1000a includes a flash memory device 100 and a memory controller 200a. The flash memory device 100 includes a memory cell array 110 and a voltage generator 120. The flash memory system 1000a of FIG. 5 is substantially similar to the flash memory system 1000 of FIG. 1, and is described below with respect to the differences between flash memory system 1000a and the flash memory system 1000. Detailed description of components of the flash memory system 1000a of FIG. 5 that are the same as corresponding components of the flash memory system 1000 will not be repeated.

The memory controller 200a includes a program counter 210, a read counter 220, and a read voltage adjustment unit 230. The memory controller 200a further includes a first randomizer 240 and a second randomizer 250, and a first de-randomizer 260 and a second de-randomizer 270 that respectively correspond to the first randomizer 240 and the second randomizer 250.

The memory controller 200a receives data DATA. The first randomizer 240 randomizes the data DATA to generate random data DATA_R. The random data DATA_R is programmed in a main region 112 of a memory cell array 110. The random data DATA_R programmed in the main region 120 may be referred to as random program data PDATA_R. The first randomizer 240 performs a randomization operation to randomly reset logic values of bits of the data DATA. Thus, it is probable that logic values of the bits of the random data DATA_R have the same distribution. In other words, about 50% of the bits of the random data DATA_R have a logic value of "0" and the other about 50% bits have a logic value of "1".

The program counter 210 receives the random data DATA_R and counts the number of bits having a first logic value from among the bits of the random data DATA_R. The result of the counting may be referred to as "program count information PC". However, the size of the random data DATA_R may be equal to that of one page, and in this case, the total number of the bits of the random data DATA_R has been predetermined. That is, the total number of the bits of the random data DATA_R may be equal to the product of the size of one page and the number of bits stored in one memory cell. Thus, it may be assumed that the size of the program count information PC is half the number of bits in one page. In this case, the program counter 210 may not be included in the memory controller 200a, and it may be assumed that the size of the program count information PC is half the number of bits included in one page.

The program count information PC is randomized by the second randomizer 250 to be changed into random program count information PC_R. The random program count information PC_R is programmed in a spare region 114 of the memory cell array 110.

The second de-randomizer 270 restores the program count information PC by reading the random program count information PC_R programmed in the spare region 114. The program count information PC is provided to the read voltage adjustment unit 230. As described above, the first randomizer 240 makes the number of bits of the random data DATA_R having the first logic value approximately half the number of bits included in one page. Thus, it may be assumed that the size of the program count information PC is about half the number of bits included in one page. In this case, the program counter 210, the second randomizer 250, and the second de-randomizer 270 may not be included in the memory controller 200a, and the program count information PC may not be stored in the memory cell array 110.

When the random program data PDATA_R is read from the main region 112, a result of the reading may be referred to as random read data RDATA_R. As described above, the random program data PDATA_R and the random read data RDA- TA_R may be different from each other. The read counter 220 generates read count information RC by counting the number of bits having the first logic value from among bits of the random read data RDATA_R. The read count information RC is provided to the read voltage adjustment unit 230.

The random read data RDATA_R is restored to the read data RDATA using the first de-randomizer 260, and the read data RDATA is transmitted to the outside by the memory controller 200*a*. The read voltage adjustment unit 230 adjusts the read voltage VR using the program count information PC related to the random program data PDATA_R stored in the memory cell array 110 and the read count information RC related to the random read data RDATA_R read from the memory cell array 110.

Figure 6A:
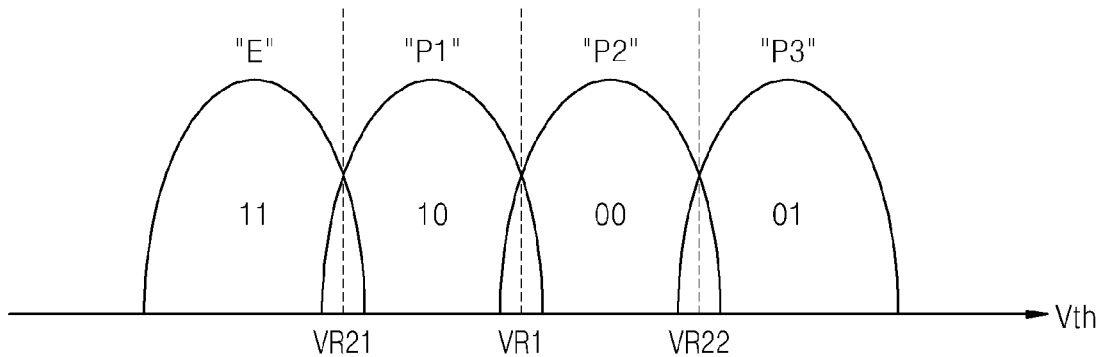
FIGS. 6A to 6F illustrate distributions of threshold voltages of memory cells according to embodiments of the inventive concept.
Figure 6B:
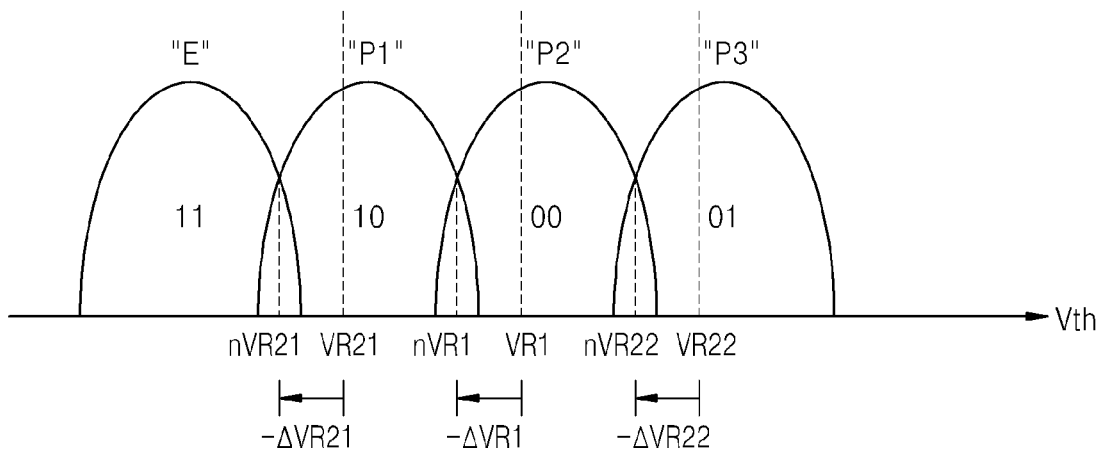
Figure 6C:
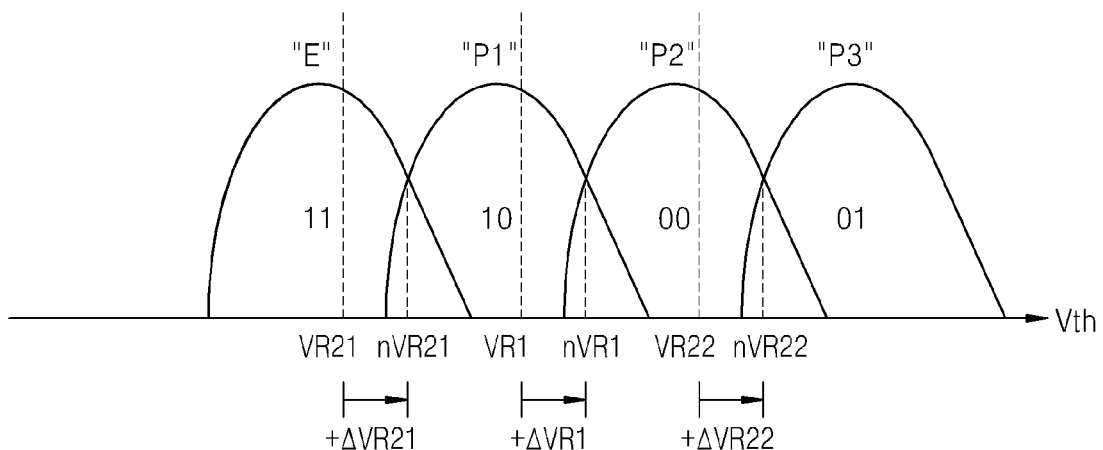
Figure 6D:
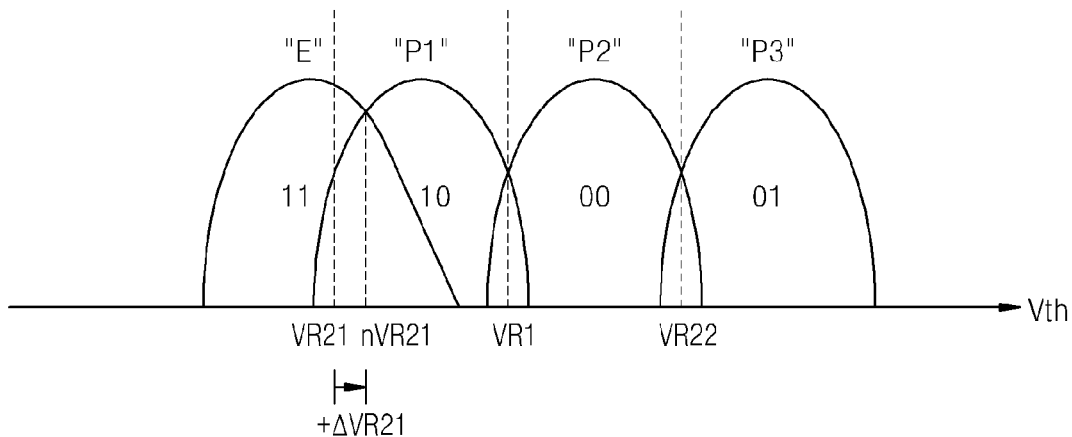
Figure 6E:
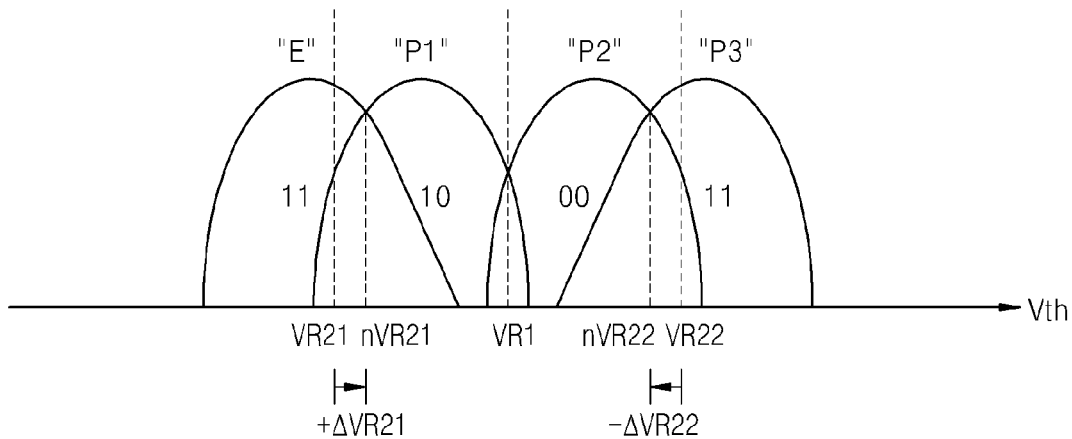
Figure 6F:
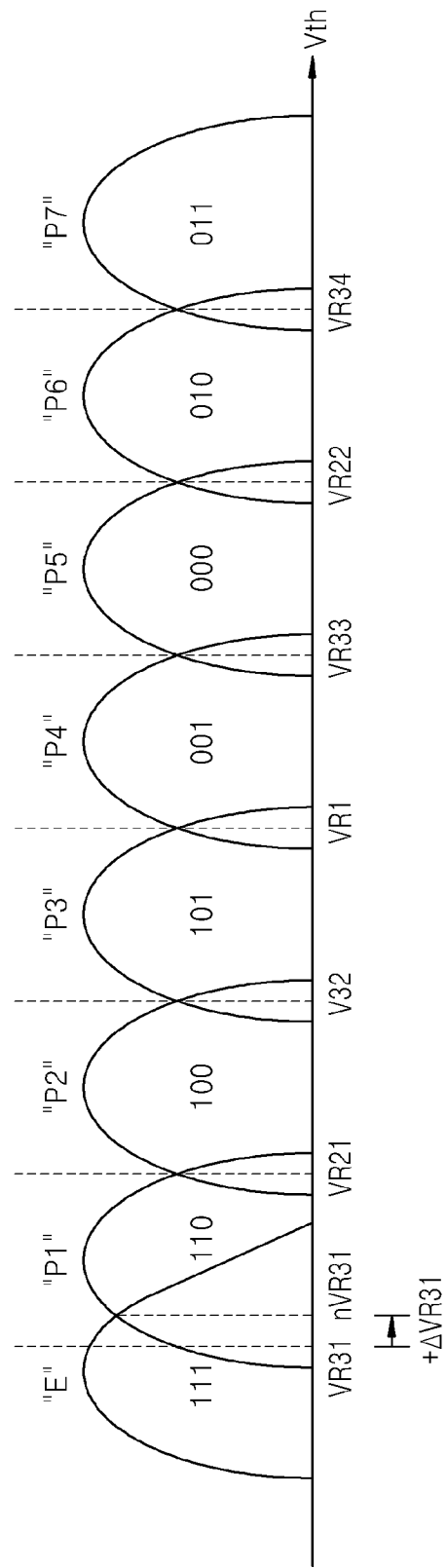

FIGS. 6A to 6F illustrate distributions of threshold voltages of memory cells according to embodiments of the inventive concept. Specifically, FIGS. 6A to 6E illustrate distributions of threshold voltages of 2-bit MLC memory cells that were programmed, and FIG. 6F illustrates distributions of threshold voltages of 3-bit MLC memory cells that were programmed.

Referring to FIG. 6A, the distributions of threshold voltages in an "E" state, a "P1" state, a "P2" state and a "P3" state respectively range beyond read voltages VR21, VR1, and VR22 on the X-axis, compared to the distributions of threshold voltages illustrated in FIG. 2(*b*). This phenomenon occurs when electrons leak from a charge storage layer, e.g., a floating gate, of a flash memory device or electrons are excessively supplied to the charge storage layer. In this case, during a read operation, an error occurs at a part of the distribution of threshold voltages in the "E" state that is greater than the read voltage VR21, and at a part of the distribution of threshold voltages in the "P1" state that is less than the read voltage VR21. Such an error similarly occurs with respect to the read voltage VR1 and the read voltage VR22. The errors may be corrected using error correction information.

Referring to FIG. 6B, the distributions of threshold voltages are slanted (or shifted) to the left, compared to the corresponding distributions in FIG. 6A. When values of bits of data stored in a first page of a memory cell are detected using the read voltage VR1, the number of bits having a logic value "1" is greater than in an initially programmed stage. In other words, when the number of bits having the logic value "1" is counted, the size of read count information RC for the first page is greater than that of program count information PC for the first page.

This phenomenon may occur when electrons stored in the memory cell are leaking as time goes by, and may occur in all of the distributions of threshold voltages in an "E" state, a "P1" state, a "P2" state, and a "P3" state. Thus, read voltages VR21, VR1, and VR22 need to be respectively changed into new read voltages nVR21, nVR1, and nVR22. To this end, voltage level compensation values −ΔVR21, −ΔVR1, and −ΔVR22 may be used.

Referring to FIG. 6B, the voltage level compensation values −ΔVR21, −ΔVR1, and −ΔVR22 may be proportional to the difference between the read count information RC and the program count information PC. The voltage level compensation values −ΔVR21, −ΔVR1, and −ΔVR22 may be determined using a read retry table that has been determined based on the difference between the read count information RC and the program count information PC. The read retry table is described in detail with reference to FIG. 8, below.

Referring to FIG. 6C, the distributions of threshold voltages are slanted to the right, compared to those in FIG. 6A. When values of bits of data stored in a first page of a memory cell are detected using a read voltage VR1, the number of bits having a logic value "1" is less than in an initially programmed stage. In other words, when the number of bits having the logic value "1" is counted, the size of read count information RC for the first page is less than that of program count information PC for the first page.

This phenomenon may occur when a gate insulating layer becomes weakened as program/erase operations are repeatedly performed on a memory cell, and may occur in all of the distributions of threshold voltages in an "E" state, a "P1" state, a "P2" state, and a "P3" state. Thus, read voltages VR21, VR1, and VR22 need to be respectively changed into new read voltages nVR21, nVR1, and nVR22. To this end, voltage level compensation values +ΔVR21, +ΔVR1, and +ΔVR22 may be used.

Referring to FIG. 6C, the voltage level compensation values +ΔVR21, +ΔVR1, and +ΔVR22 may be proportional to the difference between the read count information RC and the program count information PC. The voltage level compensation values +ΔVR21, +ΔVR1, and +ΔVR22 may be determined using a read retry table that has been determined based on the difference between the read count information RC and the program count information PC.

Referring to FIG. 6D, the distribution of threshold voltages in an "E" state is slanted to the right, compared to the distribution in the "E" state in FIG. 6A. When values of bits of data stored in the first page of a memory cell are detected using a read voltage VR1, the number of bits having a logic value "1" is substantially the same as when a program operation is performed on the memory cell. In other words, the size of read count information RC for the first page is nearly equal to that of program count information PC for the first page. However, when values of bits of data stored in a second page of the memory cell are detected using read voltages VR21 and VR22, the number of bits having the logic value "1" is less than when the program operation is performed on the memory cell. That is, the size of the read count information PC for the second page is less than that of the program count information PC for the second page.

This phenomenon may occur when a threshold voltage of a neighboring memory cell of the memory cell changes as a read operation is performed on the neighboring memory cell. In particular, a threshold voltage of the memory cell in the "E" state is increased due to a read voltage applied to the neighboring memory cell. This phenomenon is known as read disturbance. This phenomenon may be sensed by checking whether the difference between the program count information PC and the read count information RC for the first page is small, but the difference between the program count information PC and the read count information RC for the second page is relatively large. Thus, the read voltage VR21 needs to be changed to a new read voltage nVR21. To this end, a voltage level compensation value +ΔVR21 is used.

Referring to FIG. 6D, the voltage level compensation value +ΔVR21 may be proportional to the difference between the read count information RC and the program count information PC for the second page. The voltage level compensation value +ΔVR21 may be determined using a read retry table that has been determined based on the difference between the read count information RC and the program count information PC for the second page. The read retry table here is described in detail with reference to FIG. 9 below.

Referring to FIG. 6E, the distribution of threshold voltages in an "E" state is slanted to the right, compared to that in the "E" state in FIG. 6A, and the distribution of threshold voltages in a "P3" state is slanted to the left, compared to that in the "P3" state in FIG. 6A. When values of bits of data stored in a first page of a memory cell are detected using a read voltage VR1, the number of bits having a logic value "1" is substantially the same as when a program operation is performed on the memory cell. However, when values of bits of data stored in a second page of the memory cell are detected using read voltages VR21 and VR22, the number of bits having the logic value "1" is less than when the program operation is performed on the memory cell. That is, the size of the read count information PC for the second page is less than that of the program count information PC for the second page.

The slanting of the distribution of threshold voltages in the "E" state to the right may be caused by the read disturbance, and the slanting of the distribution of threshold voltages in the "P3" state having a highest threshold voltage to the left may be caused because the density of charges in a charge storage layer is high and a relatively large amount of electrons thus leaks. When this phenomenon occurs, the difference between program count information PC and read count information RC for the first page is small but the size of the program count information PC for the second page is less than that of the read count information RC for the second page. Thus, the read voltages VR21 and VR22 need to be respectively changed into new read voltages nVR21 and nVR22. To this end, voltage level compensation values +$\Delta$VR21 and +$\Delta$VR22 may be used.

Referring to FIG. 6E, the voltage level compensation values +$\Delta$VR21 and +$\Delta$VR22 may be proportional to the difference between the read count information RC and the program count information PC for the second page. The voltage level compensation value +$\Delta$VR21 may be determined using a read retry table that has been determined based on the difference between the read count information RC and the program count information PC for the second page. An example of the read retry table is described in detail with reference to FIG. 9 below.

Referring to FIG. 6F, the distribution of threshold voltages in an "E" state is slanted to the right, compared to those of threshold voltages in the other states. Thus, if values of bits of data stored in a first page of a memory cell are detected using a read voltage VR1 and values of bits of data stored in a second page of the memory cell are detected using read voltages VR21 and VR22, then program count information PC and read count information RC are substantially the same. However, when values of bits of data stored in a third page of the memory cell are detected using read voltages VR31, VR32, and VR33, the number of bits having a logic value "1" is less than when a program operation is performed on the memory cell. That is, the size of read count information RC for the third page is less than that of program count information PC for the third page.

This phenomenon may be caused by the read disturbance, and may be sensed by checking whether the difference between program count information PC and read count information RC for each of the first and second pages is small, while the difference between the program count information PC and the read count information RC for the third page is relatively large. Thus, the read voltage VR31 needs to be changed into a new read voltage nVR31. To this end, a voltage level compensation value +$\Delta$VR31 may be used.

Referring to FIG. 6F, the voltage level compensation value +$\Delta$VR31 may be proportional to the difference between the read count information RC and the program count information PC for the third page. The voltage level compensation value +$\Delta$VR31 may be determined using a read retry table that has been determined based on the difference between the read count information RC and the program count information PC for the third page.

Figure 7:
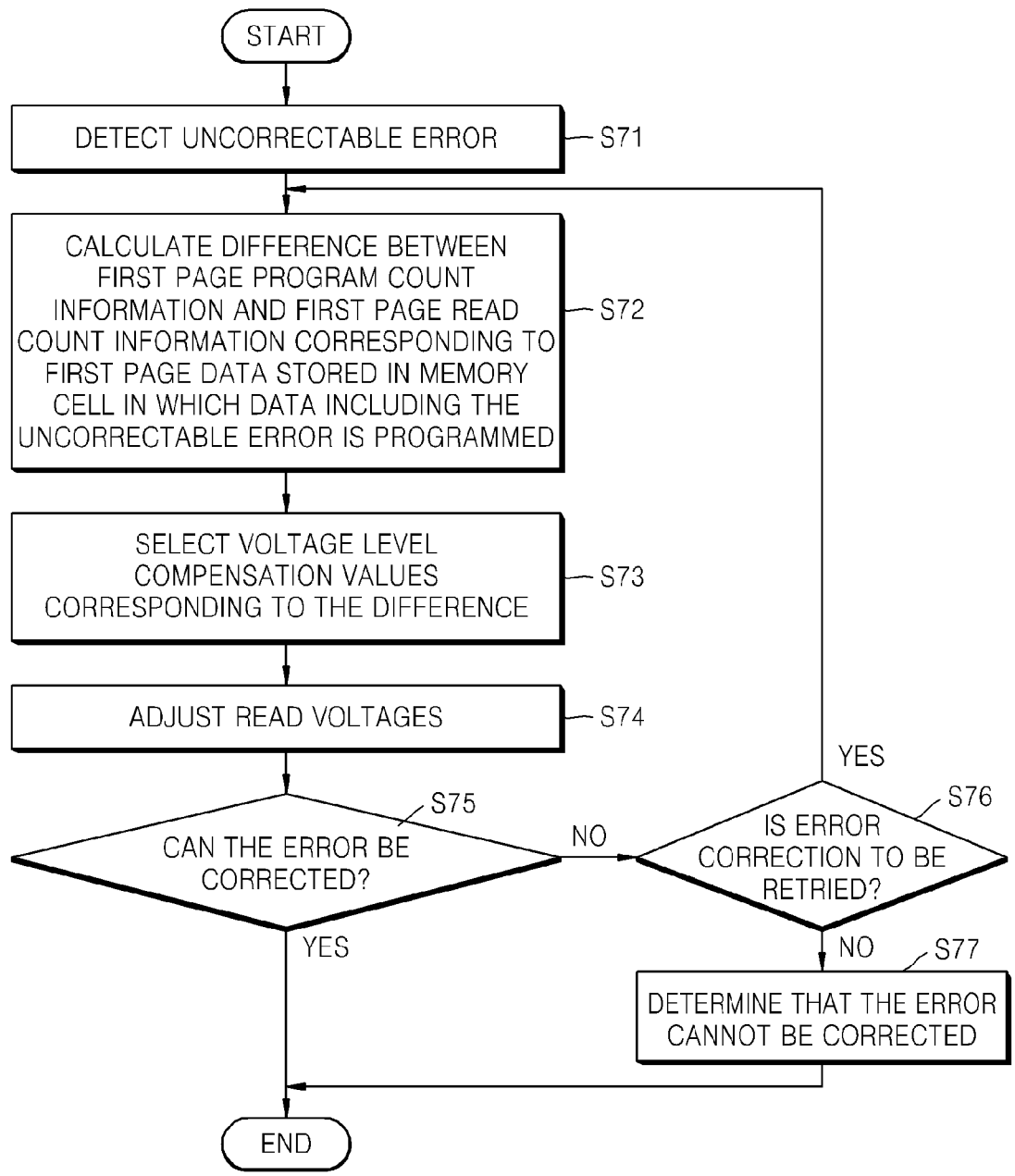
FIG. 7 is a flowchart illustrating a method of reading data from a flash memory device, according to an embodiment of the inventive concept.
Figure 8:
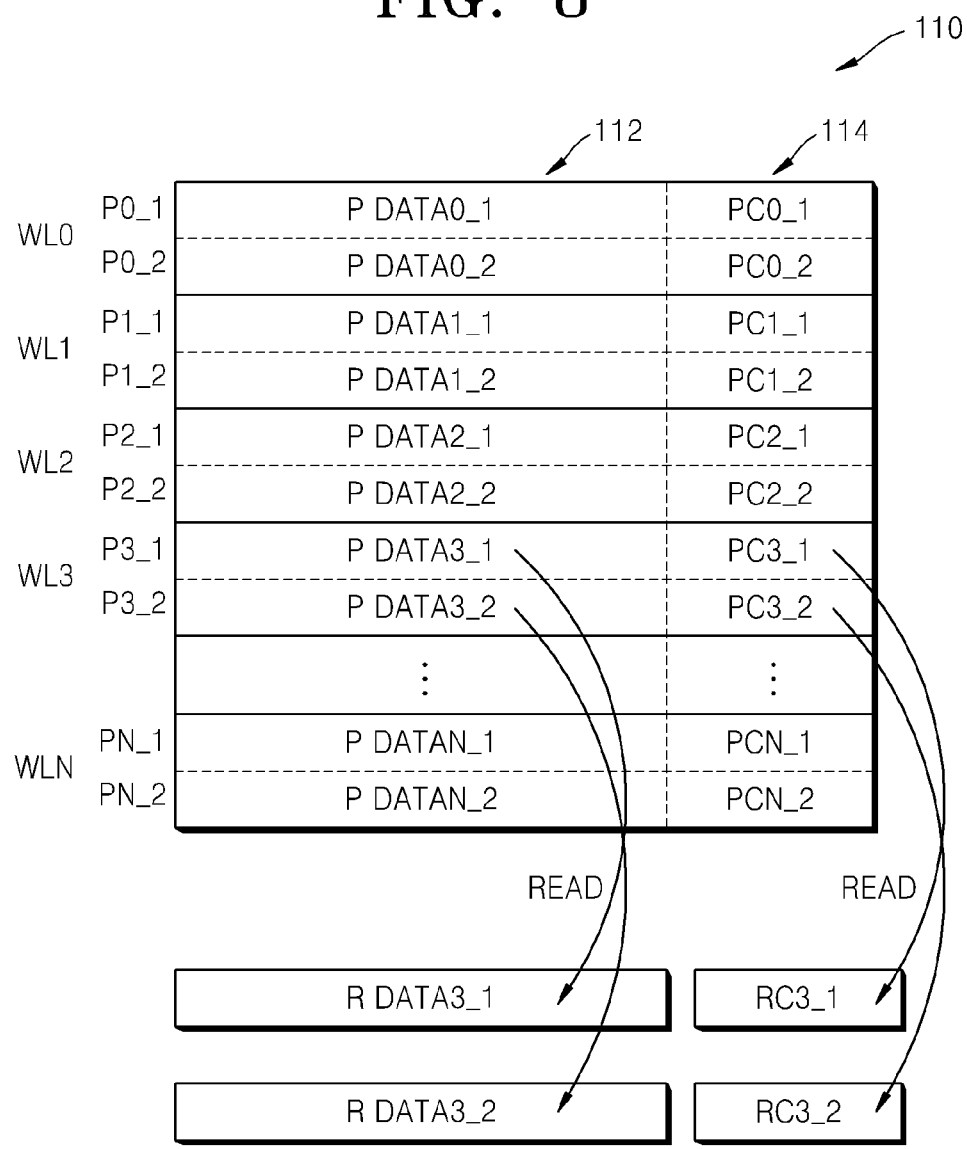
FIG. 8 illustrates data stored in a memory cell array, according to an embodiment of the inventive concept.

FIG. 7 is a flowchart illustrating a method of reading data from a flash memory device, according to an embodiment of the inventive concept. FIGS. 8 to 10 help explain the method of FIG. 7. FIG. 8 illustrates data stored in a memory cell array 110, according to an embodiment of the inventive concept. FIGS. 9 and 10 illustrate read retry tables, according to embodiments of the inventive concept.

Referring to FIGS. 7 to 10, an uncorrectable error is detected while reading data from the memory cell array 110 in operation S71. Referring to FIG. 8, the memory cell array 110 includes a main region 112 and a spare region 114. The memory cell array 110 further includes multiple memory cells (not shown), as well as word lines WL0 to WLN and bit lines (not shown). The memory cells are arranged along the word lines WL0 to WLN, and correspond to two pages from pages P0_1, P0_2 through pages PN_1, and PN_2, respectively. For example, the memory cells connected to the first word line WL0 form first page P0_1 and second page P0_2, and the memory cells connected to the second word line WL1 form first page P1_1 and second page P1_2. In this case, the memory cells are 2-bit MLCs, for example. When the memory cells are 3-bit MLCs, the memory cells connected to one word line form three pages. For convenience of explanation, it is assumed below that the memory cells are 2-bit MLCs.

In this example, first page data PDATA0_1 is programmed in the main region 112 of the first page P0_1 of the first word line WL0, and second page data PDATA0_2 is programmed in the main region 112 of the second page P0_2 of the first word line WL0. Also, first page program count information PC0_1 is programmed in the spare region 114 of the first page P0_1 of the first word line WL0, and second page program count information PC0_2 is programmed in the spare region 114 of the second page P0_2 of the first word line WL0. Similarly, page data and corresponding program count information may be respectively programmed in the first and second pages of the second word line WL1 through the (N+1)$^{th}$ word line WLN.

For convenience of explanation, the first page data PDATA0_1 programmed in the first page of a certain word line will be referred to as "programmed first page data PDATA_1", and the second page data PDATA0_2 programmed in the second page of the word line will be referred to as "programmed second page data PDATA_2". A first page program counter and a first read counter corresponding to the programmed first page data PDATA_1 will be referred to as "first page program counter PC_1" and "first read counter RC_1", respectively. Likewise, a second page program counter and a second read counter corresponding to the programmed second page data PDATA_2 will be referred to as "second page program counter PC_2" and "second read counter RC_2", respectively. Also, a result of reading the first page data PDATA0_1 will be referred to as "read first page data RDATA_1" and a result of reading the second page data PDATA0_2 will be referred to as "read second page data RDATA_2".

The memory controller 200 of FIG. 1 is configured to read data from the memory cell array 110. Uncorrectable errors may occur during the read operation. For example, an uncorrectable error may occur while reading second page data PDATA3_2 programmed in the second page P3_2 of the fourth word line WL3. The uncorrectable error may refer to an error that cannot be corrected using error correction code (ECC) for correcting errors. An error correction unit (not shown) configured to correct errors using the ECC may be included in the memory controller 200. For example, the error correction unit may provide the memory controller 200 with information that the error occurring in the second page data PDATA3_2 cannot be corrected.

In operation S72, the memory controller 200 reads the programmed first page data PDATA_1 from memory cells in which data including the uncorrectable error is programmed. Also, the memory controller 200 reads the first page program count information PC_1 corresponding to the programmed first page data PDATA_1. The memory controller 200 generates the first page read count information RC_1 by counting the number of bits having a first logic value from among bits of the read programmed first page data RDATA_1. Then, the memory controller 200 calculates the difference between the first page program count information PC_1 and the first page read count information RC_1.

Since the uncorrectable error is detected from the second page data PDATA3_2, as described above, memory cells connected to the word line WL3 in which the second page data PDATA3_2 is programmed are detected, and first page data PDATA3_1 is read from first page P3_1 of the memory cells. Also, first page program count information PC3_1 corresponding to the first page data PDATA3_1 is read. First page read count information RC3_1 of first page read data RDATA3_1 generated by reading the first page data PDATA3_1 by the memory controller 200 may be generated. Then, the memory controller 200 may calculate the difference (RC3_1–PC3_1) between the first page program count information PC3_1 and the first page read count information RC3_1.

In operation S73, the memory controller 200 may select voltage level compensation values corresponding to the difference (RC3_1–PC3_1) between the first page program count information PC3_1 and the first page read count information RC3_1. FIG. 9 illustrates a read retry table defining voltage level compensation values corresponding to the difference (RC3_1–PC3_1) between the first page read count information RC_1 and the first page program count information PC_1.

In operation S74, the read voltages are adjusted using the voltage level compensation values. The read retry table of FIG. 9 has defined degrees to which read voltages should be increased or reduced to correspond to the difference (RC_1–PC_1) between the first page read count information RC_1 and the first page program count information PC_1. For example, if the difference (RC_1–PC_1) is "220", the memory controller 220 may decrease read voltages VR21, VR1, and VR22 by –100 mV, –200 mV, and –300 mV, respectively. For example, the size of one page may be 4096 bits long, a value of the first page read count information RC_1 may be "2020", and a value of the first page program count information PC_1 may be "1800".

Conventionally, whether an error can be corrected is not determined by referring to the difference RC_1–PC_1 between the first page read count information RC_1 and the first page program count information PC_1, but by sequentially applying all voltage level compensation values defined in a read retry table. Thus, if an uncorrectable error occurs, then in the worst case of scenario, a page in which data including the uncorrectable error is programmed should be read using all of the voltage level compensation values defined in the read retry table. In this case, if 100 sets of voltage levels are defined in the read retry table, for example, the read time will be 100 times longer than when the page is simply read.

However, according to an embodiment of the inventive concept, the difference (RC_1–PC_1) between the first page read count information RC_1 and the first page program count information PC_1 is used to estimate a cause that changes a distribution of threshold voltages of memory cells. Degrees to which read voltages should be increased or reduced using the difference (RC_1–PC_1) may be directly determined, thereby preventing excessive increases to read time.

If the difference (RC_1–PC_1) between the first page read count information RC_1 and the first page program count information PC_1 falls within a predetermined range, e.g., a range from "–99" to "99", then it may be determined that an error can be corrected. In this case, the memory controller 200 may determine that memory cells of a target page do not have a distribution of threshold voltages as illustrated in FIG. 6B or 6C. That is, in this case, the memory controller 200 may determine that the memory cells of the target page are likely to have a distribution of threshold voltages as illustrated in FIG. 6D or 6E.

Also, in this case, the memory controller 200 may adjust read voltages according to an error mode as illustrated in FIG. 6D or 6E. For example, read voltages may be adjusted based on the difference (RC_2–PC_2) between the second page read count information RC_2 and the second page program count information PC_2. In particular, some of the read voltages may be adjusted.

The read retry table of FIG. 10 defines degrees to which some of the read voltages should be increased or reduced according to the difference (RC_2–PC_2) between the second page read count information RC_2 and the second page program count information PC_2. For example, if the difference (RC_2–PC_2) is "–120", then the memory controller 200 increases/decreases read voltages VR21, VR1, and VR22 by +50 mV, 0 mV, and 0 mV or by +30 mV, 0 mV, and –40 mV, respectively. The read voltages VR21, VR1, and VR22 may be respectively increased by +50 mV, 0 mV, and 0 mV when memory cells are expected to have a distribution of threshold voltages as illustrated in FIG. 6D, and may be respectively increased/decreased by +30 mV, 0 mV, and –40 mV when the memory cells are expected to have a distribution of threshold voltages as illustrated in FIG. 6E.

If the difference (RC_2–PC_2) between the second page read count information RC_2 and the second page program count information PC_2 falls within a predetermined range, e.g., a range from "–49" to "49", it may be determined that error correction should be retried or an error cannot be corrected. A number of times that error correction can be performed may be predetermined. Also, error correction may be performed by sequentially applying all sets of voltage levels, as in a conventional method.

As described above, in operation S75, after the read voltages are adjusted, data including an uncorrectable error may be read, and whether the error can be corrected may be determined. When the error can be corrected, the method of FIG. 7 ends. When the error cannot be corrected, the method proceeds to operation S76 to determine whether error correction is to be retried. This determination may be made, for example, by determining whether the number of times that error correction was performed is less than the number of times that error correction can be performed. When the number of times that error correction was performed is less than the number of times that error correction can be performed, the method proceeds to operation S72. When the number of times that error correction was performed is greater (or equal to) than the number of times that error correction can be performed, the method proceeds to operation S77. In operation S77 it is determined that the error cannot be corrected, and the method of FIG. 7 ends.

The read retry tables of FIGS. 9 and 10 are merely illustrative, and thus embodiments of the inventive concept are not limited thereto. Also, read retry tables may be obtained from a combination of possible distributions of the difference (RC_1−PC_1) between the first page read count information RC_1 and the first page program count information PC_1 and the difference (RC_2−PC_2) between the second page read count information RC_2 and the second page program count information PC_2. In a read retry table, voltage level compensation values may be statistically defined.

Figure 11:
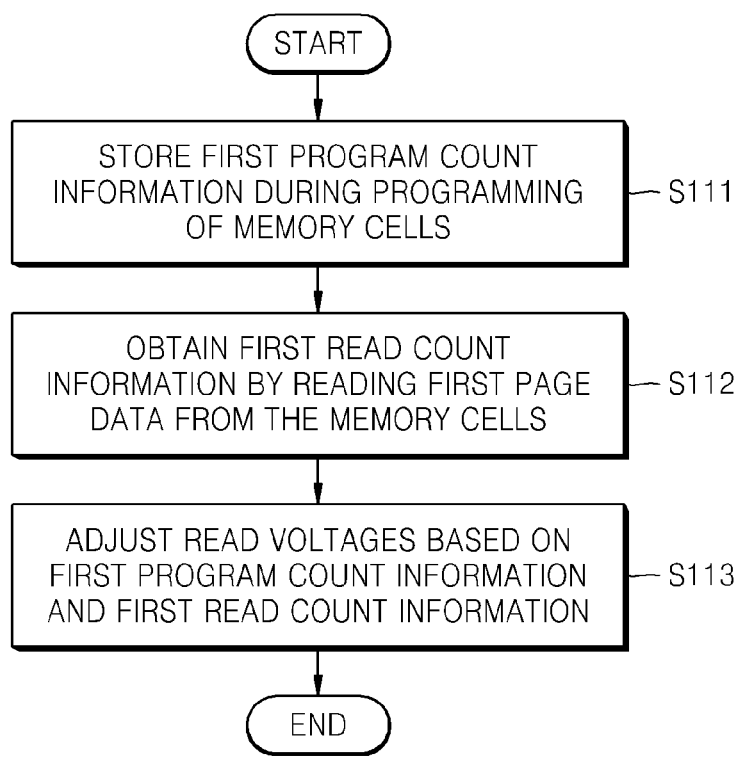
FIG. 11 is a flowchart illustrating a method of adjusting a read voltage in a flash memory device, according to an embodiment of the inventive concept.

FIG. 11 is a flowchart illustrating a method of adjusting a read voltage in a flash memory device, according to an embodiment of the inventive concept. Referring to FIG. 11, in operation S111, first program count information is stored when memory cells of the flash memory device are programmed. Each of the memory cells has at least one page. The memory cells may be SLCs or MLCs. The first program count information indicates the number of bits having a first logic value from among bits of data programmed in first pages of the memory cells.

In operation S112, first read count information is obtained by reading first page data from the memory cells. The first read count information is the number of bits having the first logic value from among bits of data read from the first pages of the memory cells. Read voltages may be used to read the first page data. In operation S113, the read voltages are adjusted based on the difference between the first program count information and the first read count information.

The read voltages may be adjusted by applying voltage level compensation values for the read voltages, which correspond to the difference between the first program count information and the first read count information, to the read voltages. In this case, the read voltages may be increased or reduced to be proportional to the difference between the first program count information and the first read count information.

As described above with reference to FIG. 5, before performing operation S111, data input to a memory controller may be randomized and programmed in the memory cells. In this case, data programmed in the first pages of the memory cells may be randomized data. The first program count information may also be randomized and stored in a spare region of the memory cells. Then, the randomized first program count information stored in the spare region may be de-randomized and read.

The data read from the memory cells may be de-randomized between when operation S111 is performed and when operation S112 is performed. Also, the data read from the first pages of the memory cells may be data to be de-randomized. The first read count information may be the number of bits having the first logic value from among bits of data, which are read from the memory cells and are then de-randomized.

Similarly, second program count information regarding data programmed in second pages of the memory cells also may be stored. The second program count information is the number of bits having the first logic value of data programmed in the second pages. Second read count information is obtained from the data read from the second pages of the memory cells. The second read count information indicates the number of bits having the first logic value from among bits of the data read from the second pages. In this case, read voltages may be adjusted using not only the difference between the first program count information and the first read count information, but also the difference between the second program count information and the second read count information.

Accordingly, an error mode may be determined based on the difference between the first program count information and the first read count information and the difference between the second program count information and the second read count information. The memory controller may have one or more read retry tables corresponding to the error mode, such as those illustrated in FIGS. 9 and 10. Voltage level compensation values of the read voltages, which correspond to the difference between the first program count information and the first read count information and the difference between the second program count information and the second read count information, may be obtained from the read retry table(s). The read voltages are adjusted by applying the voltage level compensation values thereto.

The error mode may be determined according to whether the difference between the first program count information and the first read count information falls within a predetermined range. Also, the error mode may be determined by comparing the first program count information and the first read count information with each other. For example, when the size of the first program count information is greater than that of the first read count information, the error mode may be determined to have a distribution of threshold voltages as illustrated in FIG. 6C. In this case, the read values may be increased. When the value of the first program count information is less than that of the first read count information, the error mode may be determined to have a distribution of threshold voltages as illustrated in FIG. 6B. In this case, the read voltages may be reduced. When the difference between the first program count information and the first read count information falls within the predetermined range, the error mode may be determined to have a distribution of threshold voltages as illustrated in FIG. 6C or 6D. In this case, some of the read voltages may be increased and/or reduced based on the difference between the second program count information and the second read count information.

Figure 12:
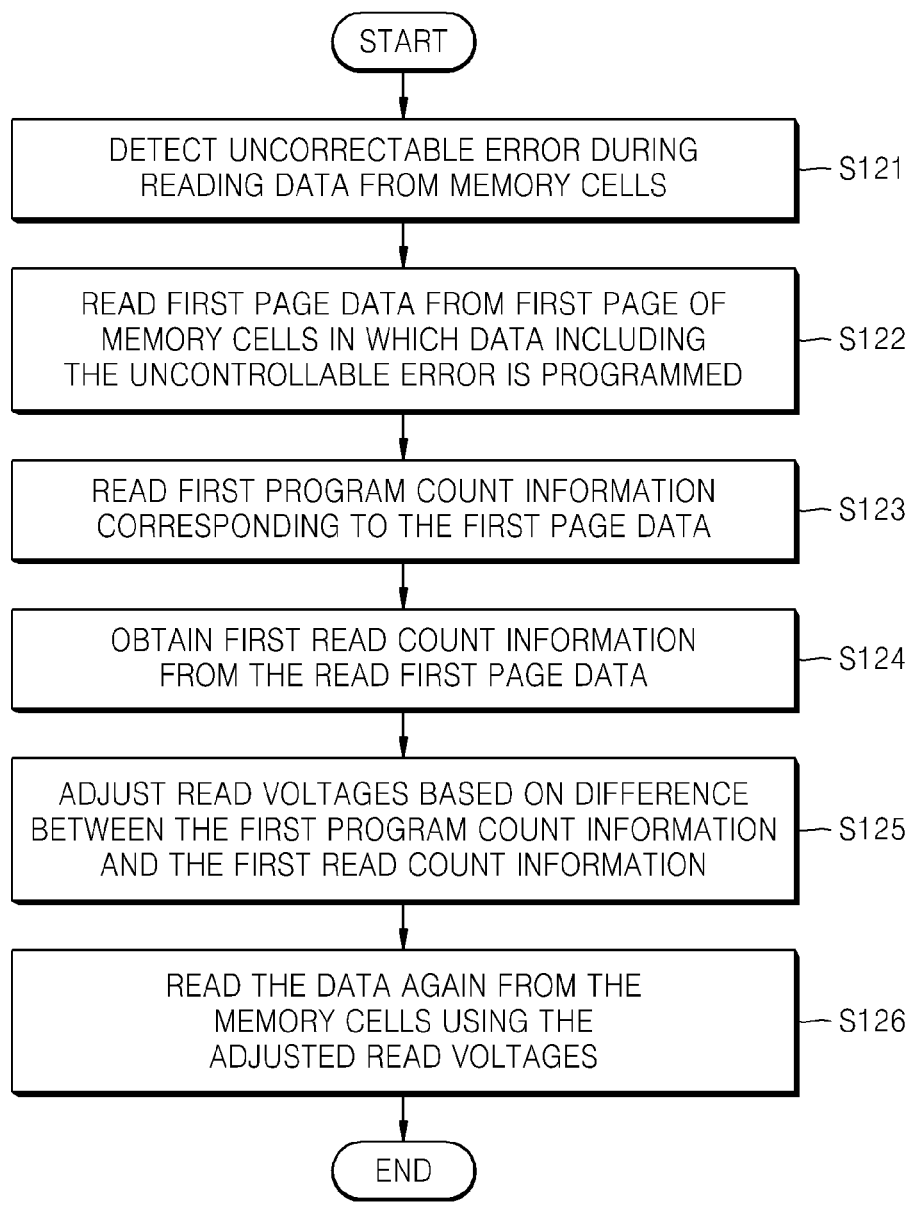
FIG. 12 is a flowchart illustrating a method of reading data from a flash memory device, according to another embodiment of the inventive concept.

FIG. 12 is a flowchart illustrating a method of reading data from a flash memory device, according to another embodiment of the inventive concept. Referring to FIG. 12, in operation S121, an uncorrectable error is detected while reading data from memory cells of the flash memory device. In operation S122, first page data is read from first pages of memory cells in which data including the uncorrectable error is programmed. In operation S123, first program count information corresponding to the first page data is read. The first program count information may be the number of bits having a first logic value from among the bits of the first page data programmed in the first pages of the memory cells. In operation S124, first read count information is obtained from the read first page data. The first read count information may be the number of bits having the first logic value from among the bits of the first page data read from the first pages. In operation S125, read voltages are adjusted based on the difference between the first program count information and the first read count information. In operation S126, the data is read again from the memory cells using the adjusted read voltages.

When the difference between the first program count information and the first read count information falls within a predetermined range, second page data may be read from second pages of the memory cells in which the data having the uncorrectable error is programmed. Second program count information corresponding to the second page data is read. The second program count information is the number of bits from among the bits of the second page data programmed in the second pages of the memory cells. Second read count information, which is the number of bits from among the bits of the second page data read from the second page, is obtained. Some of the read voltages may be adjusted based on the difference between the second program count information and the second read count information.

Figure 13:
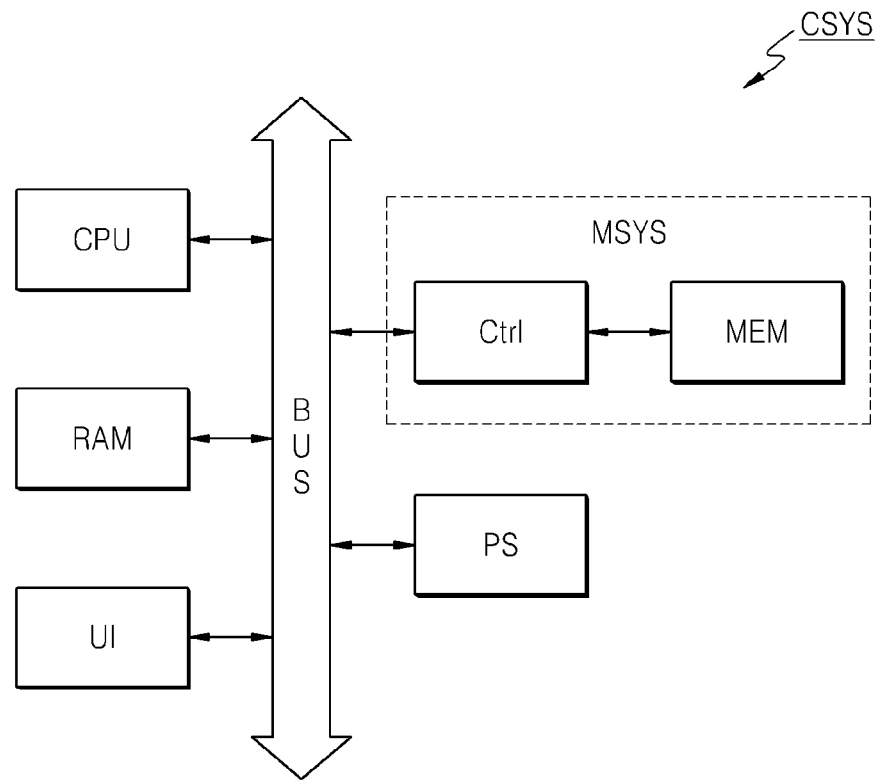
FIG. 13 is a block diagram of a computing system device according to an embodiment of the inventive concept.

FIG. 13 is a block diagram of a computing system device CSYS, according to an embodiment of the inventive concept. The computing system device CSYS includes a central processing unit (CPU), a user interface (UI), and a semiconductor memory system MSYS that are electrically connected via a bus BUS. The semiconductor memory system MSYS includes a memory controller Ctrl and a semiconductor memory device MEM. The semiconductor memory device MEM is configured to store N-bit data that was processed or is to be processed by the central processing unit CPU, where "N" denotes an integer that is equal to or greater than "1". The semiconductor memory device MEM may be the flash memory device 100 of FIG. 1 or 5, and the memory controller Ctrl may be the memory controller 200 or 200a of FIG. 1 or 5, for example.

The computing system device CSYS may further include a power supply device PS. If the semiconductor memory device MEM is a flash memory device, the computing system device CSYS may further include a volatile memory device, e.g., random access memory (RAM). If the semiconductor memory device MEM is a mobile device, a battery that supplies operating voltage to the computing system device CSYS and a modem, such as a baseband chipset, may be additionally provided. The computing system device CSYS may further include an application chipset, a camera image processor (CIS), mobile dynamic random access memory (DRAM), and the like, as would be apparent to one of ordinary skill in the art.

Figure 14:
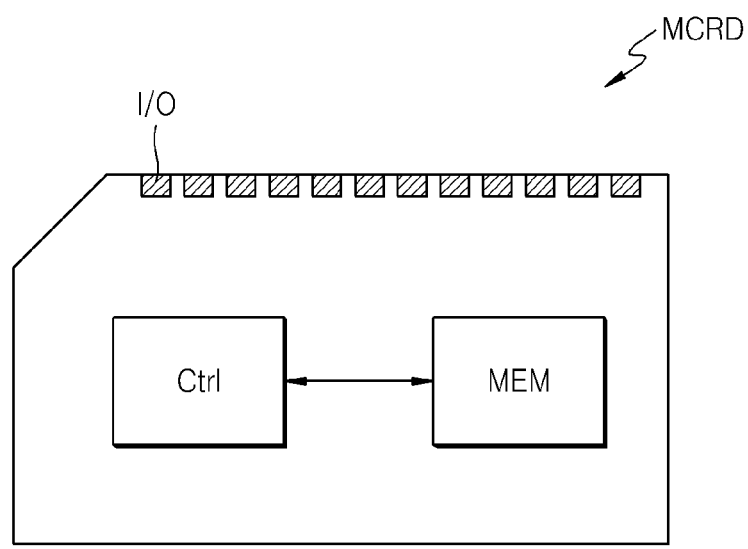
FIG. 14 is a block diagram of a memory card according to an embodiment of the inventive concept.

FIG. 14 is a block diagram of a memory card MCRD, according to an embodiment of the inventive concept. Referring to FIG. 14, the memory card MCRD includes a memory controller Ctrl and a memory device MEM. The memory controller Ctrl controls programming of data in the memory device MEM and/or controls reading of data from the memory device MEM, in response to a request received from an external host (not shown) via an input/output (I/O) unit. If the memory device MEM is the flash memory device 100 of FIG. 1 or 5, the memory controller Ctrl may adjust read voltages of the memory device MEM, similar to the memory controller 200 or 200a of FIG. 1 or 5, for example. Although not shown, in order to control the programming and the reading, the memory controller Ctrl of the memory card MCRD may further include, for example, interface units that perform an interface with the external host, and RAM that performs an interface with the memory device MEM. The memory card MCRD may be embodied as a compact flash card (CFC), a Microdrive, a smart media card (SMC), a multimedia card (MMC), a security digital card (SDC), a memory stick, a universal serial bus (USB) flash memory, or the like, for example.

Figure 15:
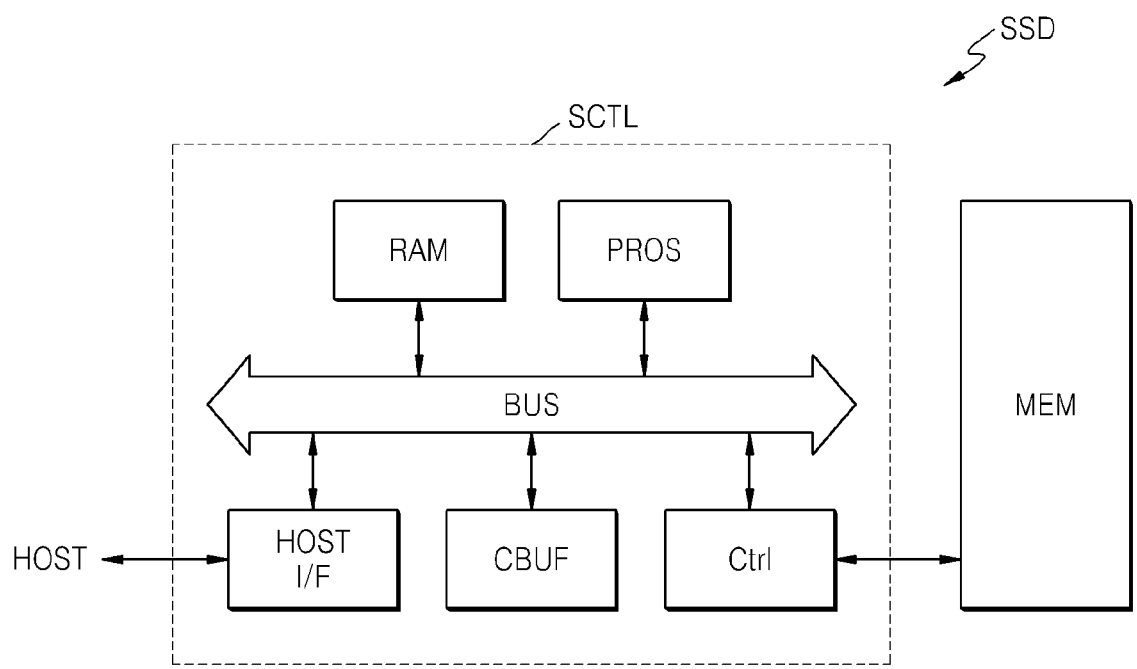
FIG. 15 is a block diagram of a solid state drive (SSD) according to an embodiment of the inventive concept.

FIG. 15 is a block diagram of a solid state drive (SSD), according to an embodiment of the inventive concept. Referring to FIG. 15, the SSD includes an SSD controller SCTL, and a memory device MEM. The SSD controller SCTL may include a processor PROS, RAM, a cache buffer CBUF, and a memory controller Ctrl that are connected via a bus BUS. The processor PROS controls the memory controller Ctrl to exchange data with the memory device MEM, in response to a request, e.g., a command, an address and/or data, from a host (not shown). The processor PROS and the memory controller Ctrl of the SSD may be embodied as one Advanced RISC Machine (ARM) processor, for example. Data for operating the processor PROS may be loaded into the RAM.

A host interface HOST I/F receives a request from the host and transmits the request to the processor PROS, and/or transmits data received from the memory device MEM to the host. The host interface HOST I/F may interface with the host using any of various interface protocols, e.g., a universal serial bus ARM (USB), man machine communication (MMC), peripheral component interconnect-express (PCI-E), serial advanced technology attachment (SATA), parallel advanced technology attachment (PATA), small computer system interface (SCSI), enhanced small device interface (ESDI), and intelligent drive electronics (IDE). Data that is to be transmitted to the memory device MEM or that is received from the memory device MEM may be temporarily stored in the cache buffer CBUF. The cache buffer CBUF may be static RAM (SRAM), for example. The memory device MEM included in the SSD may be the flash memory device 100 of FIG. 1 or 5, and the memory controller Ctrl included in the SSD controller SCTL of the SSD may be the memory controller 200 or 200a of FIG. 1 or 5, for example.

A semiconductor memory device according to the above one or more embodiments may be mounted using any of various types of packages, e.g., Package on Package (PoP), Ball Grid Arrays (BGAs), Chip Scale Packages (CSPs), Plastic Leaded Chip Carrier (PLCC), Plastic Dual In-Line Package (PDIP), a Die in Waffle Pack, a Die in Wafer Form, a Chip On Board (COB), a Ceramic Dual In-Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a Thin Quad Flatpack (TQFP), a System In Package (SIP), a Multi-Chip Package (MCP), Wafer-level Fabricated Package (WFP), and a Wafer-Level Processed Stack Package (WSP).

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of adjusting a read voltage in a flash memory device, the method comprising:
   storing first program count information when first pages of flash memory cells are programmed, the first program count information indicating a number of bits having a first logic value from among bits of data programmed in the first pages of the flash memory cells;
   obtaining first read count information by counting a number of bits having the first logic value from among bits of data read from the first pages of the flash memory cells, while reading data from the flash memory cells using read voltages; and
   adjusting the read voltages based on the difference between the first read count information and the first program count information.

2. The method of claim 1, wherein adjusting of the read voltages comprises applying voltage level compensation values of the read voltages to the read voltages, the voltage level compensation values corresponding to the difference between the first read count information and the first program count information.

3. The method of claim 1, wherein adjusting the read voltages comprises increasing or reducing the read voltages to be proportional to the difference between the first read count information and the first program count information.

4. The method of claim 1, further comprising:
   storing second program count information during the programming of the flash memory cells, the second program count information indicating a number of bits having the first logic value from among bits of data programmed in second pages of the flash memory cells; and obtaining second read count information by counting a number of bits having the first logic value from among bits of data read from the second pages of the flash memory cells, while reading data from the flash memory cells, wherein adjusting the read voltages is further based on the difference between the second read count information and the second program count information.

5. The method of claim 4, wherein adjusting the read voltages comprises:

determining an error mode based on the difference between the first read count information and the first program count information and the difference between the second read count information and the second program count information;

reading voltage level compensation values of the read voltages, which correspond to the difference between the first read count information and the first program count information and the difference between the second read count information and the second program count information, according to the error mode; and respectively applying the voltage level compensation values to the read voltages.

6. The method of claim 4, wherein, when the difference between the first read count information and the first program count information falls within a predetermined range, adjusting the read voltages comprises increasing or reducing some of the read voltages, based on the difference between the second read count information and the second program count information.

7. The method of claim 1, further comprising:

randomizing received data and programming a result of the randomizing in the flash memory cells; and de-randomizing data read from the flash memory cells.

8. The method of claim 1, further comprising:

randomizing the first program count information and storing a result of the randomizing in a spare region of the flash memory cells; and de-randomizing and reading the result of the randomizing stored in the spare region.

9. A method of reading data from a flash memory device, the method comprising:

when an uncorrectable error is detected while reading data from flash memory cells using read voltages, each flash memory cell having at least one page, reading first page data as first read data from first pages of the flash memory cells in which data having the uncorrectable error is programmed;

reading first program count information, stored when the first page data is programmed in the first pages of the flash memory cells, wherein the first program count information is a number of bits having a first logic value from among bits of the first page data;

obtaining first read count information, which is a number of bits having the first logic value from among bits of the first page read data;

adjusting the read voltages based on the difference between the first read count information and the first program count information; and reading the data again from the first pages of the flash memory cells using the adjusted read voltages.

10. The method of claim 9, wherein adjusting the read voltages comprises:

reading voltage level compensation values of the read voltages corresponding to the difference between the first read count information and the first program count information, based on a read retry table defining the voltage level compensation values; and respectively applying the voltage level compensation values to the read voltages.

11. The method of claim 9, wherein the first logic value is a logic value in an erase state, when size of the first program count information is greater than size of the first read count information, the read voltages are increased to be proportional to the difference between the first read count information and the first program count information, and when the size of the first program count information is less than the size of the first read count information, the read voltages are reduced to be proportional to the difference between the first read count information and the first program count information.

12. The method of claim 9, wherein the flash memory cells are M-bit multi-level cells, wherein M denotes an integer that is equal to or greater than "2", and the first pages are pages that are first programmed in the flash memory cells.

13. The method of claim 9, further comprising:

when the difference between the first read count information and the first program count information falls within a predetermined range, reading second page data as second page read data from a second page of the flash memory cells in which the data having the uncorrectable error is programmed;

reading second program count information, stored when the second page data is programmed in the second pages of the flash memory cells, wherein the second program count information is a number of bits having the first logic value from among bits of the second page data;

obtaining second read count information that is a number of bits having the first logic value from among bits of the second page read data; and adjusting some of the read voltages based on the difference between the first read count information and the second program count information.

14. The method of claim 13, wherein the flash memory cells are M-bit multi-level cells, wherein M denotes an integer that is equal to or greater than "2", the first pages are pages that are first programmed in the flash memory cells, and the second pages are pages that are lastly programmed in the flash memory cells.

15. The method of claim 14, wherein the first logic value is a logic value in an erase state, when size of the second program count information is greater than size of the second read count information, a lowest read value from among the read voltages is increased, and when the size of the second program count information is less than the size of the second read count information, the lowest read value from among the read voltages is reduced.

16. A flash memory system, comprising:

a flash memory device comprising a memory cell array having a plurality of memory cells, and a voltage generator configured to generate a program voltage and a read voltage; and a memory controller configured to control programming of data in the memory cells using the program voltage and to control reading the data from the memory cells using the read voltage, the memory controller comprising:

a program counter configured to provide first program count information when first pages of the memory cells in the memory cell array are programmed, the first program count information indicating a number of bits having a first logic value from among multiple bits of the data to be programmed in the first pages of the memory cells;

a read counter configured to provide first read count information indicating a number of bits having the first logic value from among bits of the data read from the first pages of the memory cells; and a read voltage adjustment unit configured to calculate the difference between the first read count information and the first program count information, and to generate a voltage level compensation signal based on the difference, wherein the voltage generator of the flash memory device adjusts the read voltage for reading the data from the memory cells based on the voltage level compensation signal.

17. The flash memory system of claim 16, wherein the program counter is further configured to provide second program count information during the programming of the memory cells, the second program count information indicating a number of bits having the first logic value from among bits of data programmed in second pages of the memory cells; and the read counter is further configured to provide second read count information indicating a number of bits having the first logic value from among bits of data read from the second pages of the flash memory cells, while data is being read from the memory cells.

18. The flash memory system of claim 17, wherein the read voltage adjustment unit is further configured to calculate the difference between the second read count information and the second program count information, and to generate the voltage level compensation signal further based on the difference.

19. The flash memory system of claim 16, wherein the memory controller further comprises:

a first randomizer configured to randomize the data to be programmed in the first pages of the memory cells; and a first de-randomizer configured to de-randomize the data read from the first pages of the memory cells.

20. The flash memory system of claim 19, wherein the memory controller further comprises:

a second randomizer configured to randomize the first program count information, which is stored as random program count information in a spare region of the memory cell array; and a second de-randomizer configured to restore the first program count information by reading and de-randomizing the random program count information stored in the spare region.

* * * * *